United States Patent [19]

Fuse et al.

[11] Patent Number: 5,026,658
[45] Date of Patent: Jun. 25, 1991

[54] METHOD OF MAKING A TRENCH CAPACITOR DRAM CELL

[75] Inventors: Genshu Fuse; Toshio Yamada, both of Hirakata; Shinji Odanaka, Sakai; Masaki Fukumoto, Osaka, all of Japan

[73] Assignee: Matsushita Electric Industrial Co., Ltd., Osaka, Japan

[21] Appl. No.: 404,470

[22] Filed: Sep. 8, 1989

Related U.S. Application Data

[60] Division of Ser. No. 218,456, Jul. 7, 1988, Pat. No. 4,920,390, which is a continuation of Ser. No. 877,968, Jun. 24, 1986, abandoned.

[30] Foreign Application Priority Data

Jul. 2, 1985 [JP] Japan ............................. 60-145568
Sep. 6, 1985 [JP] Japan ............................. 60-198076

[51] Int. Cl.⁵ ............................................ H01L 21/70
[52] U.S. Cl. .................................... 437/52; 437/60; 437/203; 437/228; 437/233; 437/235; 437/919
[58] Field of Search ................. 437/318, 47, 52, 60, 437/203, 228; 357/236, 55; 365/188; 156/643, 656

[56] References Cited

U.S. PATENT DOCUMENTS 4,353,086 10/1982 Jaccodine et al. .................... 437/52

FOREIGN PATENT DOCUMENTS 0012752 1/1985 Japan .
0136256 6/1986 Japan ................................. 357/236

Primary Examiner—Olin Chaudhuri
Assistant Examiner—Tom Thomas
Attorney, Agent, or Firm—Wenderoth, Lind & Ponack

[57] ABSTRACT

Disclosed is a semiconductor memory device (DRAM) which includes a plurality of island regions, at least one cell transistor disposed on each island region and cylindrical capacitor surrounding said each island region. By so composing, the capacity of the cell capacitor incorporated into a small space can be increased.

Also disclosed is method of fabricating a semiconductor memory device which includes a step of forming a groove having a necessary depth in a semiconductor substrate, a step of depositing a membrane excelling in coverage on it, a step of etching by an etching method having a strong anisotropy in the vertical direction while leaving said deposit membrane on sidewall, and a step of etching deeper the exposed portion of the semiconductor surface in the groove and forming capacity element and isolation region by using this deep trench.

6 Claims, 19 Drawing Sheets a-a' Section b-b' Section

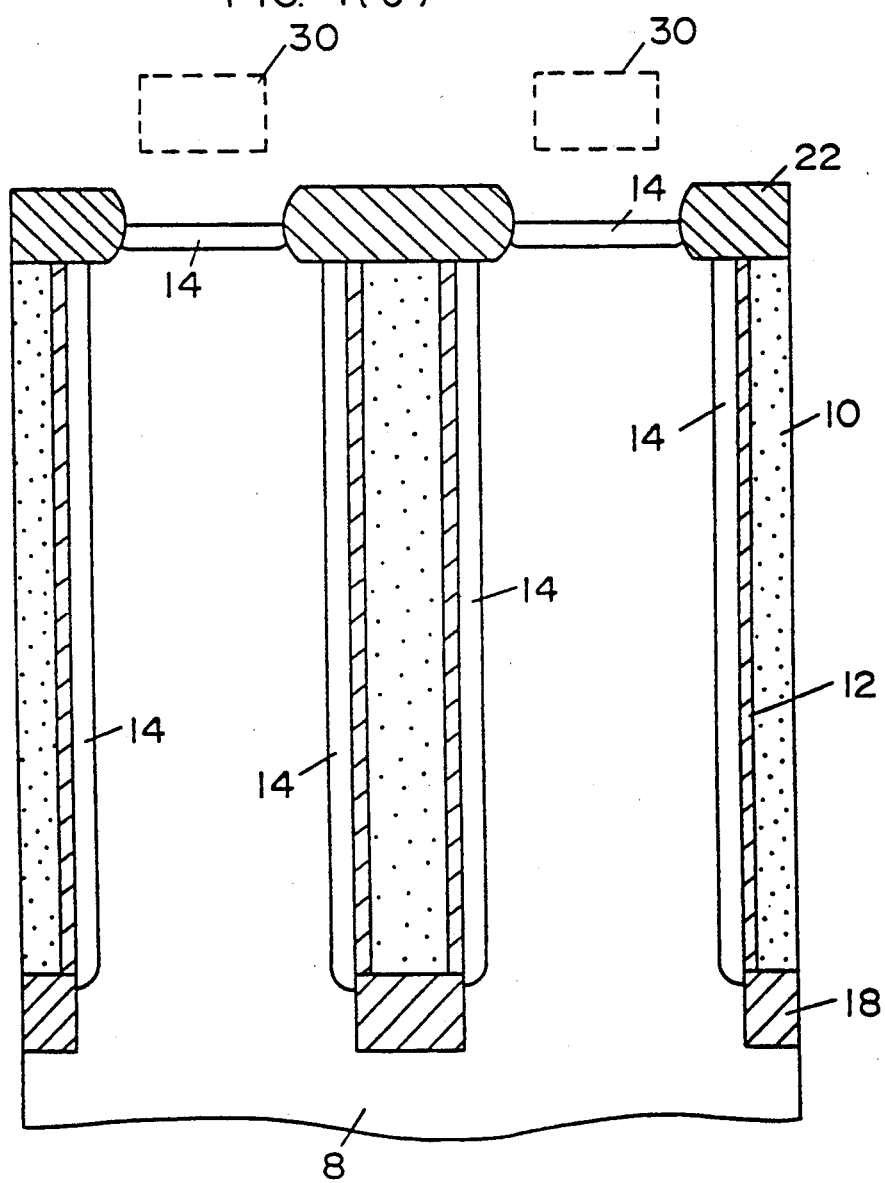

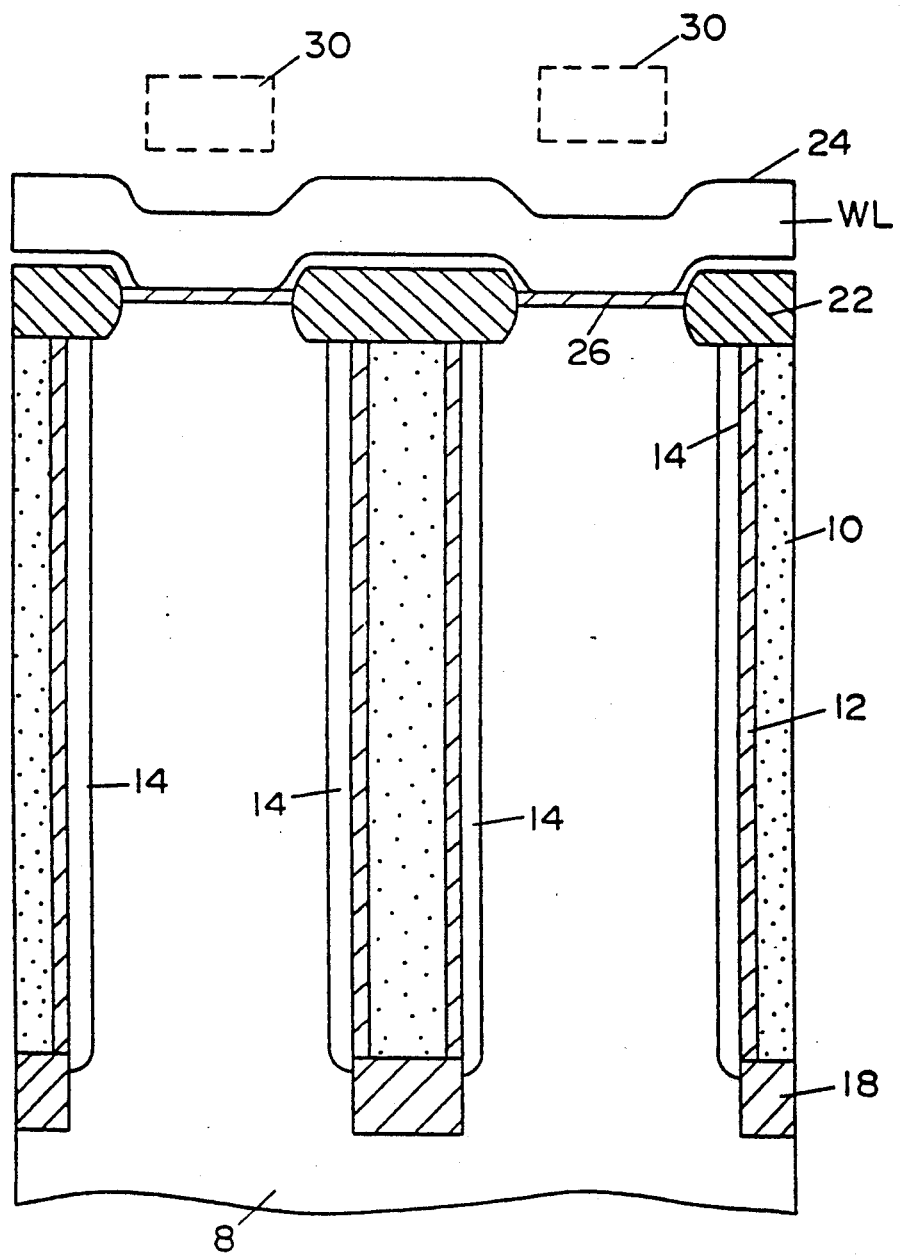
FIG. 4(D) d-d' Section e-e' Section f-f' Section g-g' Section

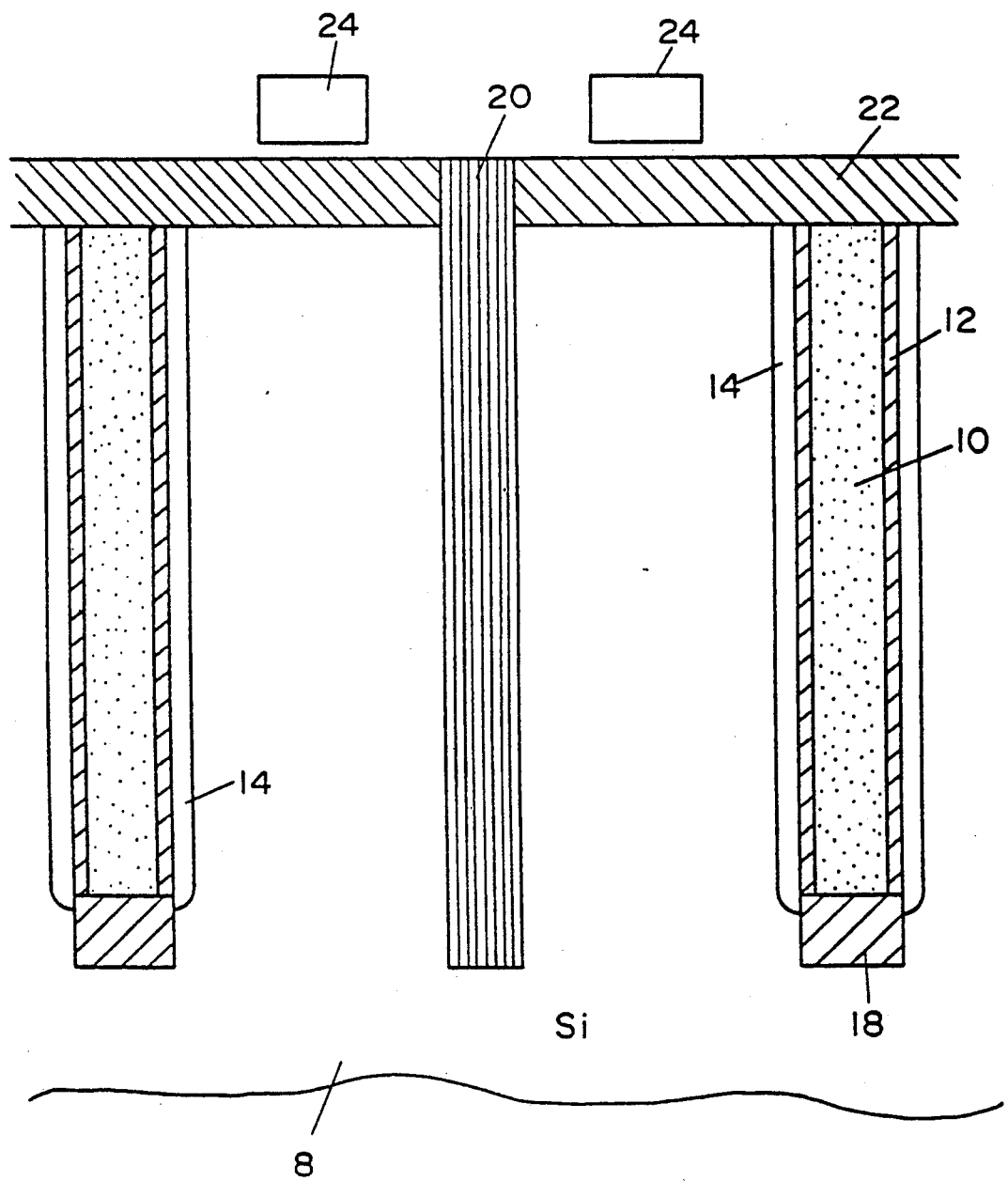

i-i' Section

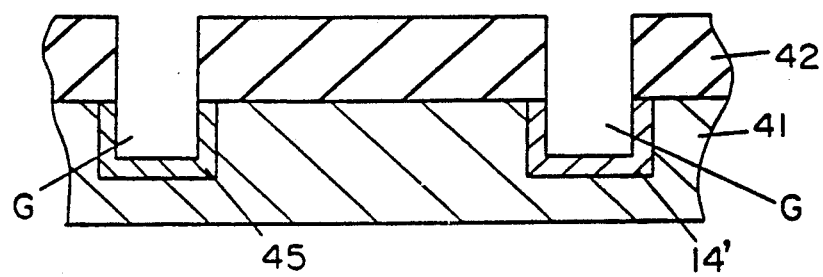
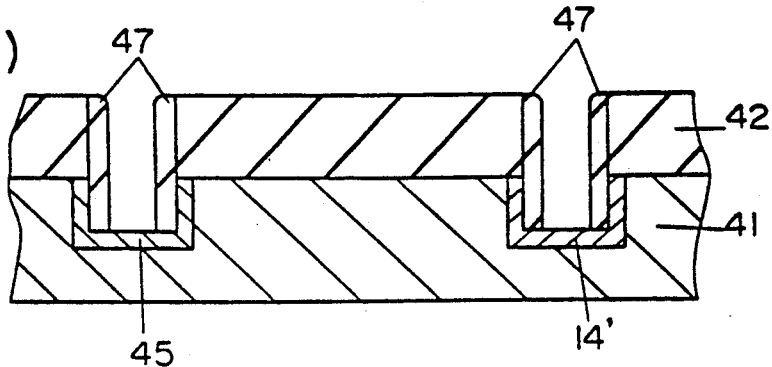

METHOD OF MAKING A TRENCH CAPACITOR DRAM CELL

This is a Rule 60 Division appln. of Ser. No. 07/218,456 filed July 7, 1988) now U.S. Pat. No. 4,920,390, which in turn is a Continuation application of Ser. No. 06/877,968 now abandoned.

BACKGROUND OF THE INVENTION

1. Field of the Invention

This invention relates to a semiconductor memory device and a method of fabricating the same, and more particularly to a semiconductor memory device such as a DRAM having a large capacity capacitor formed, in a small space, and a method of fabricating such a capacitor easily.

2. Description of the Related Art

For a dynamic memory (DRAM), a storage capacitor and a cell transistor are indispensable, and to move highly integrate the memory, it is necessary to reduce the area of storage capacitor. However, the prevention of soft errors caused by alpha-particle or noise, advantageously results when the capacity of the storage capacitor is larger. To solve this contradiction, it has been attempted to etch grooves in the silicon substrate and use the sidewall of the grooves as storage capacitor. One of the examples of this structure was proposed as "Structure sharing the isolation layer and storage capacitor in a dynamic RAM" at lecture numbers 9.3, 9.4, 9.5 at the International Electron Device Meeting (IEDM) held in the United States in December 1984. This proposal is unique in that the storage capacitor and the isolation layer are fabricated in one common groove. That is, by forming the storage capacitor on the sidewall of a groove, its area is increased. The devices are isolated by the bottom of the groove.

In the conventional memory cell structure in this example, the storage capacitor is formed at the side of a cell transistor, at a position isolated from this transistor. Accordingly, to directly and more highly integrate this memory cell structure, it is necessary to etch the groove deeper, which may give rise to difficulty in the fabricating process. Besides, because of its specific structure, the process may be extremely complicated.

SUMMARY OF THE INVENTION

It is hence a primary object of this invention to present a semiconductor memory device in an easy-to-fabricate composition, with a large capacity cell capacitor realized in a small space, by forming a substantially cylindrical cell capacitor so as to surround an island region which forms a cell transistor.

It is another object of this invention to manufacture a semiconductor memory device including this substantially cylindrical cell capacitor easily by employing existing manufacturing technology.

These and other objects are accomplished by a semiconductor memory device according to the invention, of which device includes plural island regions, at least one cell transistor provided in each island region, and a substantially cylindrical cell capacitor disposed so as to surround said each island region.

In a first illustrative embodiment, two cell transistors are formed in each island region, and these two cell transistors are isolated by an insulation layer, and by this insulation layer, said cell capacitor is separated into two halves.

In a second illustrative embodiment, only one cell transistor is formed in each island region.

In a third illustrative embodiment, said cell capacitor is comprised of a cylindrical first electrode, a cylindrical second electrode, and a cylindrical dielectric layer which extends between said first and second electrodes.

In a fourth illustrative embodiment, one of a source and a drain which make up said cell transistor is integrally formed together with one of said first and second electrodes.

In the first illustrative embodiment, a shallow isolation region is formed at the end wall of said cylindrical cell capacitor, and by this isolation region, the source, drain, and channel portions of said transistor are isolated from the capacitor. The isolation region is disposed either at both side edges of the end wall of the cylindrical capacitor, or at one side edge of the end wall of the cylindrical capacitor.

This invention further relates to a method of fabricating a semiconductor memory device characterized by a step of forming grooves in a semiconductor substrate, a step of depositing a membrane having excellent covering characteristics to the inside of said grooves, a step of etching said deposit membrane by an etching method having a strong anisotropy in the vertical direction to leave said deposit membrane only on the sidewall of said grooves, and a step of etching the exposed portions of the semiconductor substrate surface deeply in the grooves to form a semiconductor memory device by using this deeply etched groove portion as part of a capacity element or isolation region. The membrane having excellent covering characteristics is an insulation film. An electrode is formed, by way of a thin insulation film, in the groove formed by the second silicon etching, and it is used as a cell capacitor.

According to the present invention as described herein, the following benefits, among others, are obtained:

(1) Since the substantially cylindrical cell capacitor is formed in a manner to surround the island region which forms a cell capacitor, a cell capacitor having a large capacity can be realized in a small space, and the integration of the semiconductor memory device may be further heightened in a state free from soft errors.

(2) Since the groove formation in the semiconductor substrate is divided into two steps and a cell capacitor can be easily formed in this groove, the semiconductor memory device can be fabricated by conventional manufacturing technology.

While the novel features of the invention are set forth with particularity in the appended claims, the invention, both as to organization and content, will be better understood and appreciated, along with other objects and features thereof, from the following detailed description taken in conjunction with the drawings, in which:

BRIEF DESCRIPTION OF THE DRAWINGS

FIG. 1 (A) shows an equivalent circuit diagram of a memory cell of the device of the first embodiment;

DETAILED DESCRIPTION OF THE PREFERRED EMBODIMENT

Figure 1A:
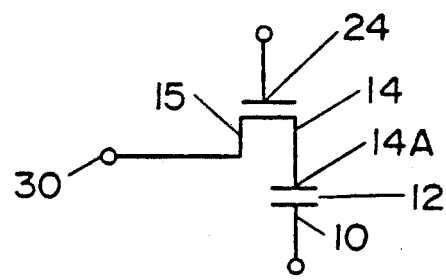
FIG. 1 (B) is a perspective view showing a partially cut-away section of a semiconductor memory device in a first embodiment of this invention.
Figure 1B:
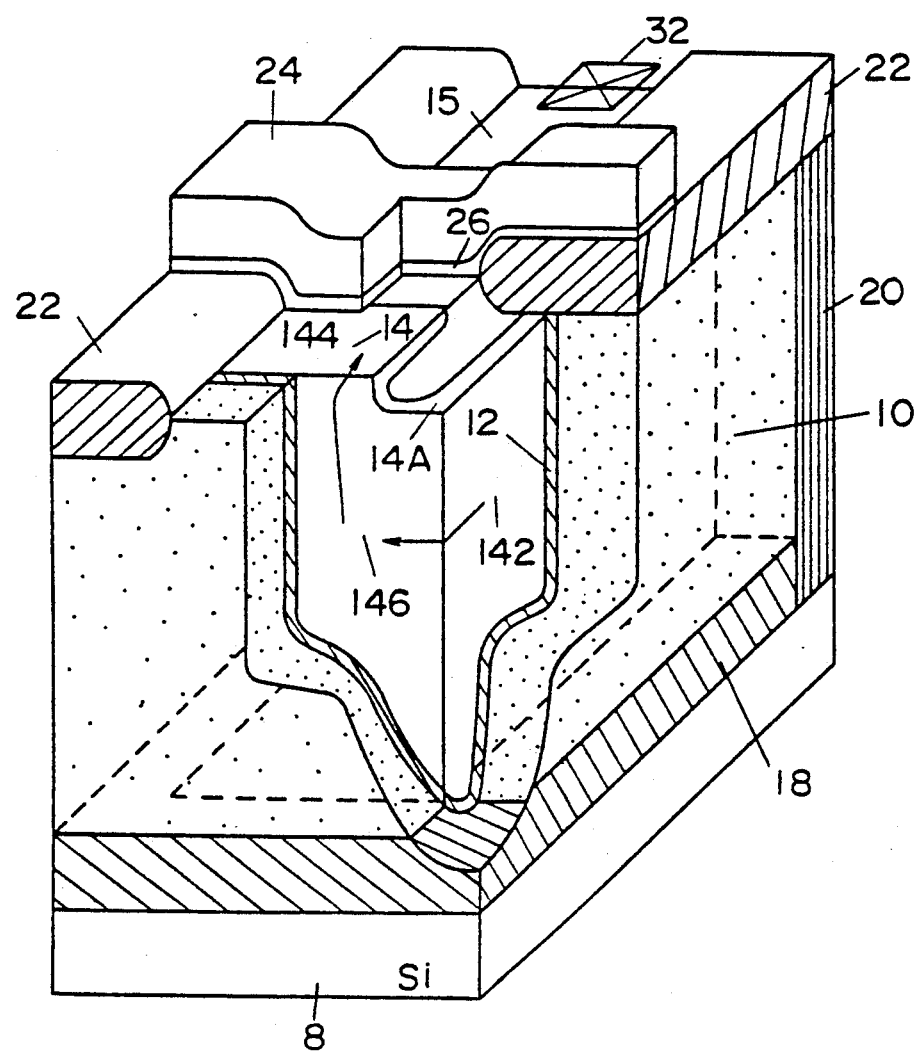
Figure 2:
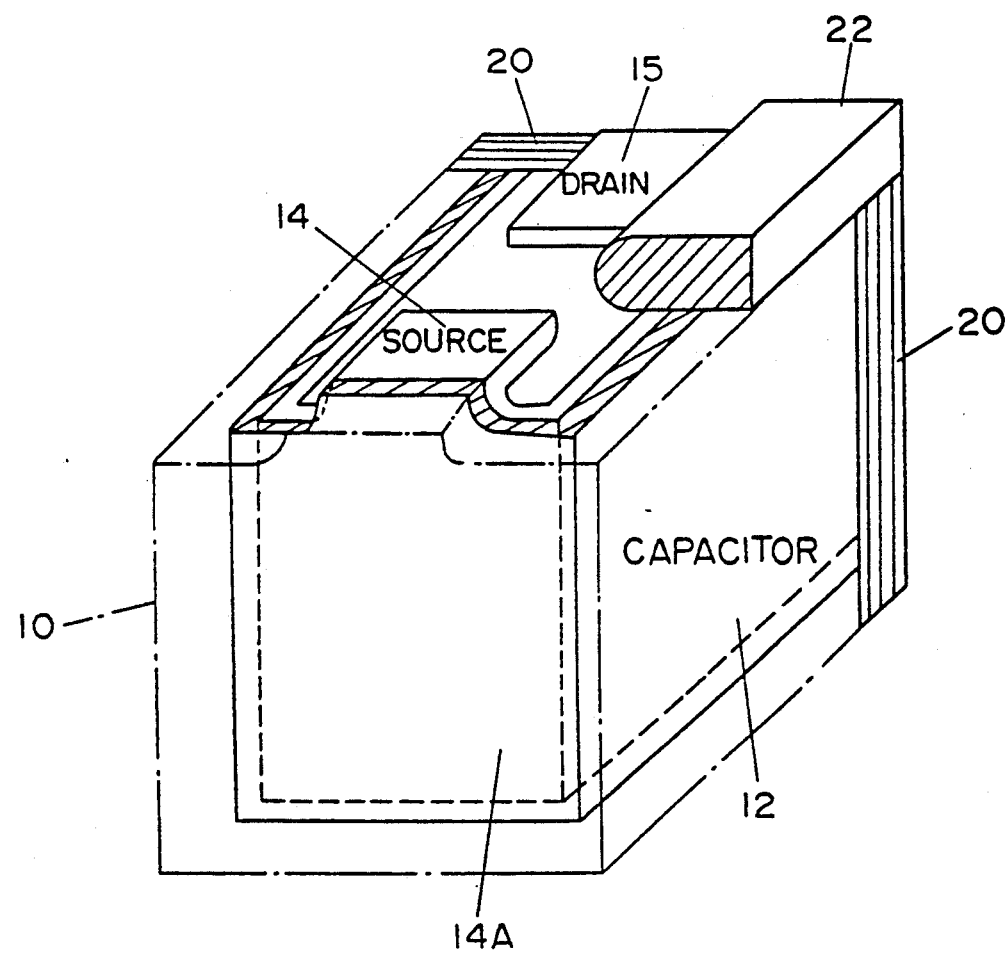
FIG. 2 is a perspective view showing the capacitor portion of the device of the first embodiment.
Figure 3:
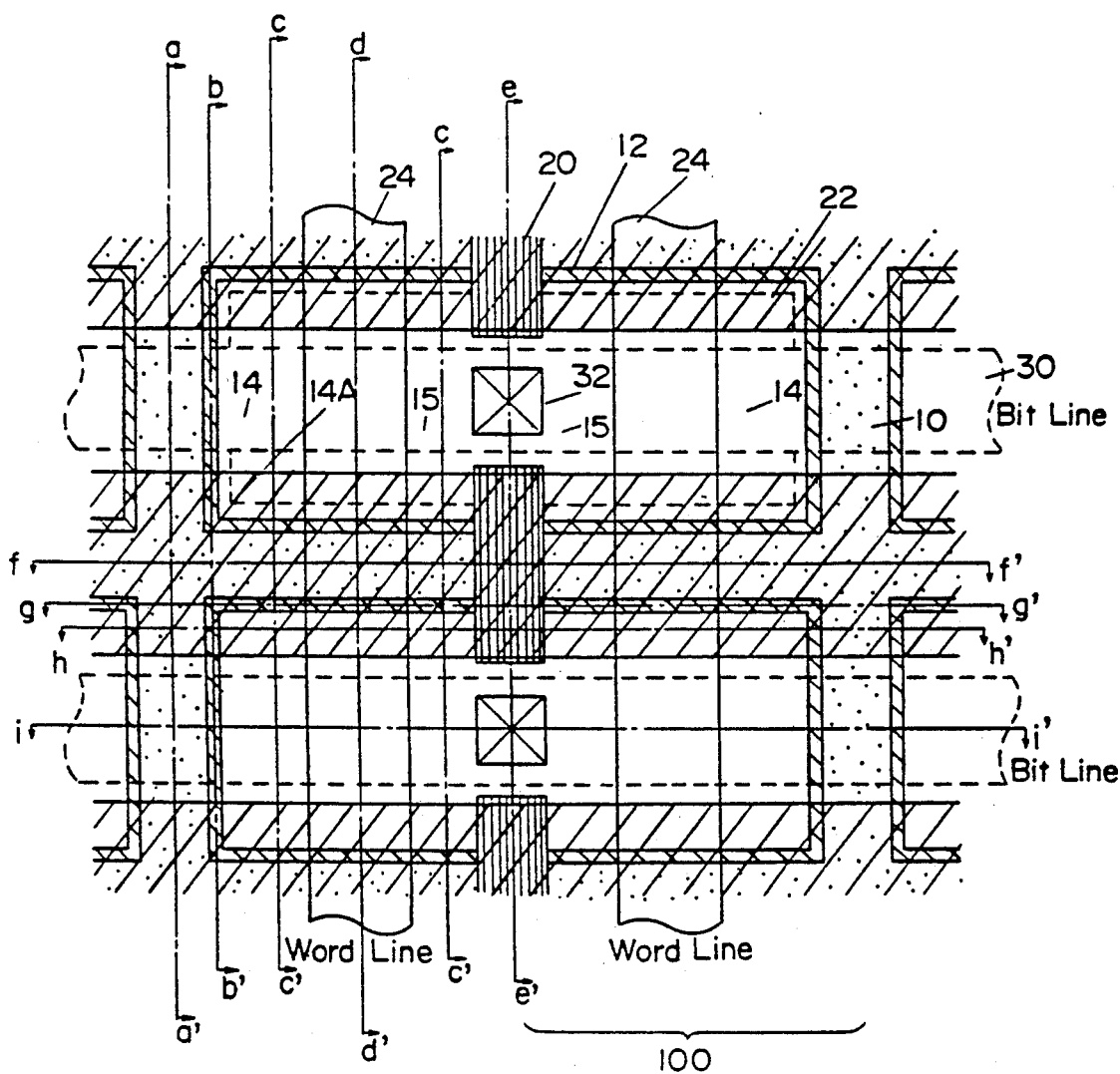
FIG. 3 is a plan view of essential parts of the device in the first embodiment.
Figure 4A:
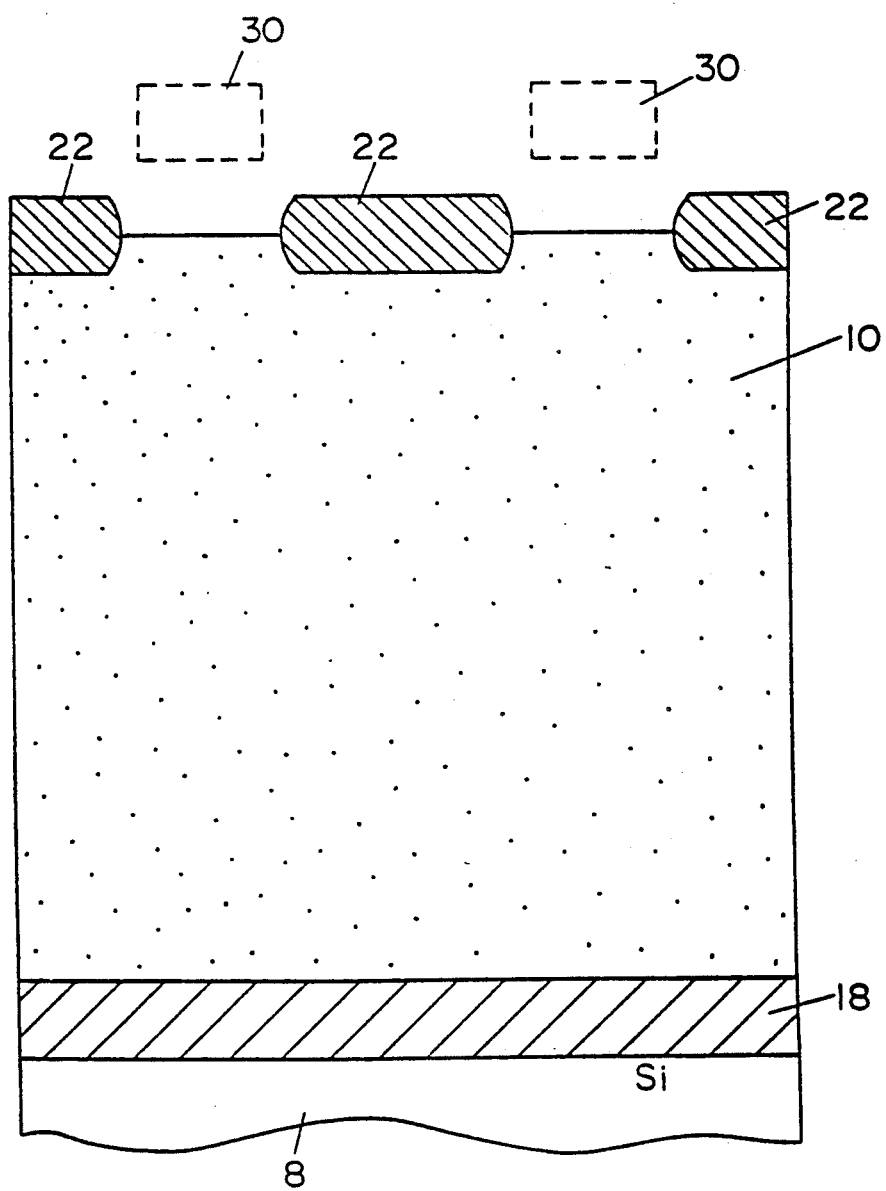
FIG. 4 (A) to (I) are the views taken along lines a—a' to i—i' respectively, in FIG. 3.
Figure 4B:
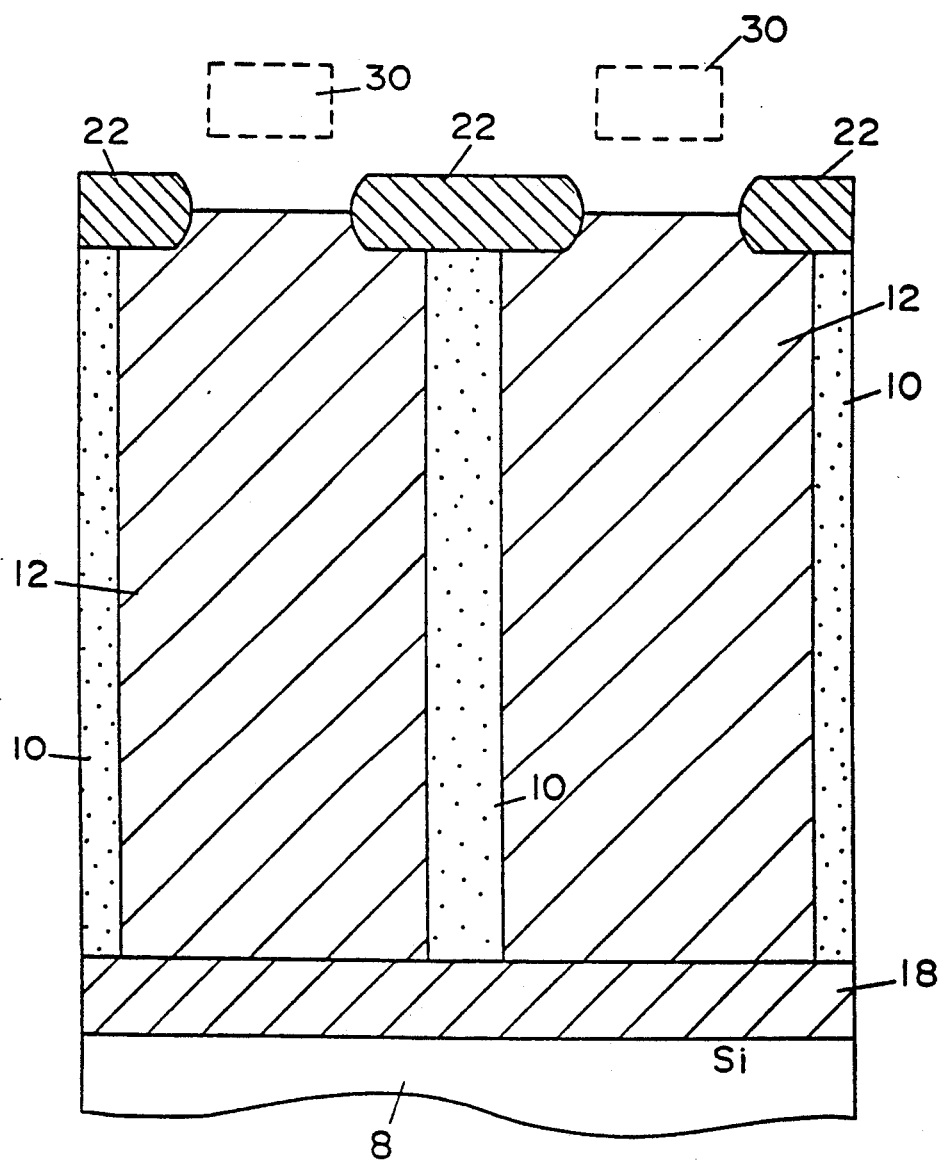
Figure 4E:
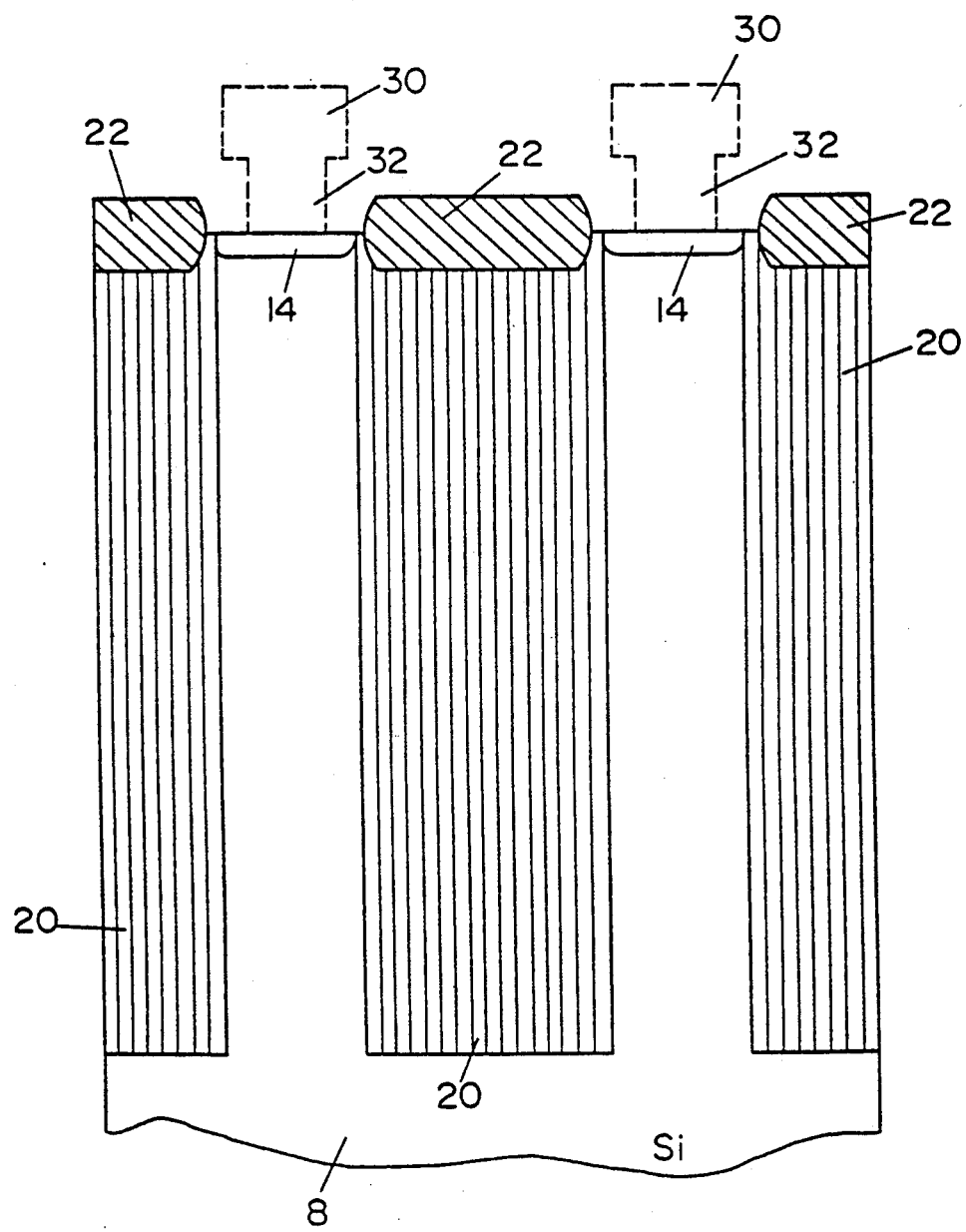
Figure 4F:
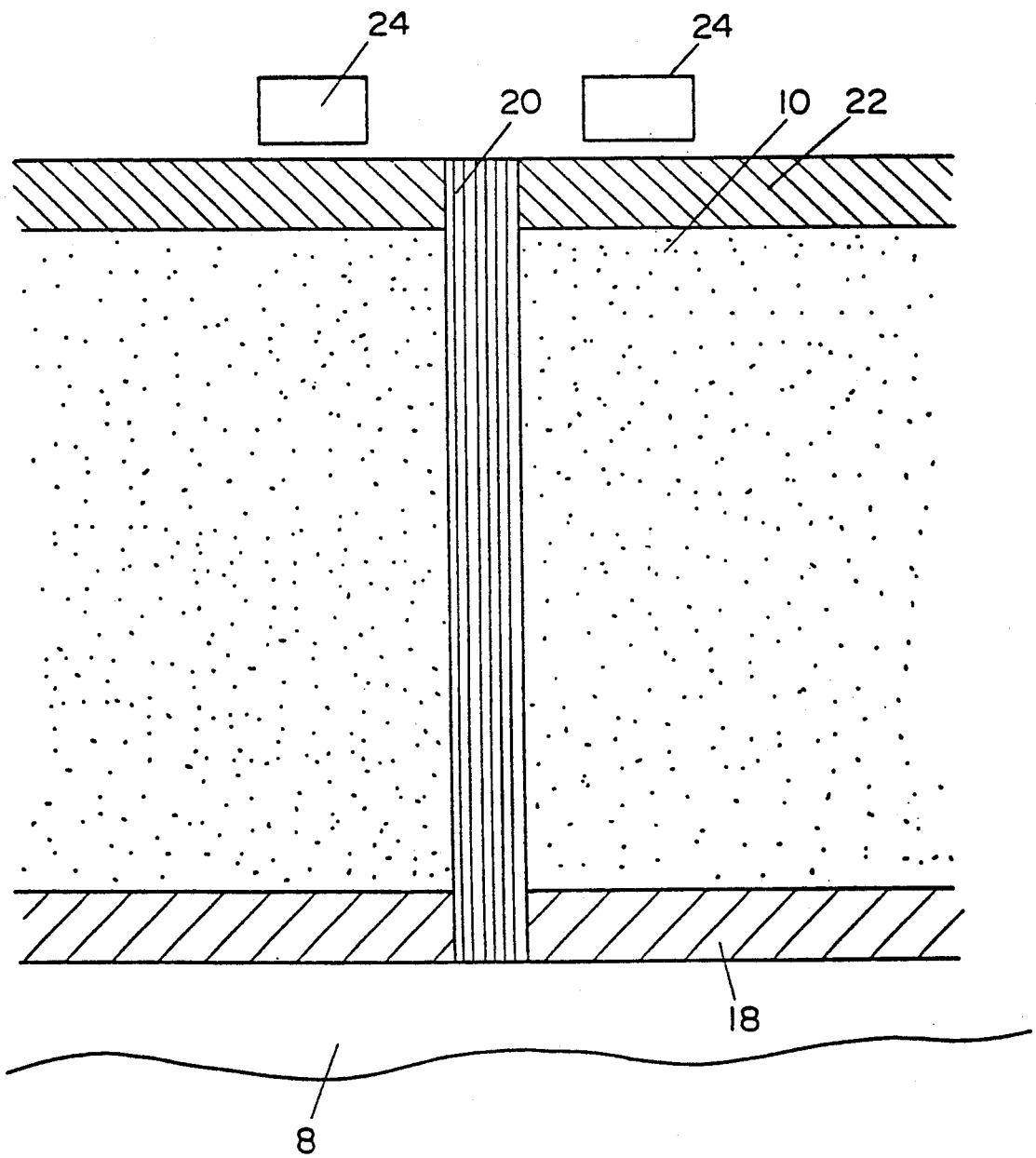
Figure 4G:
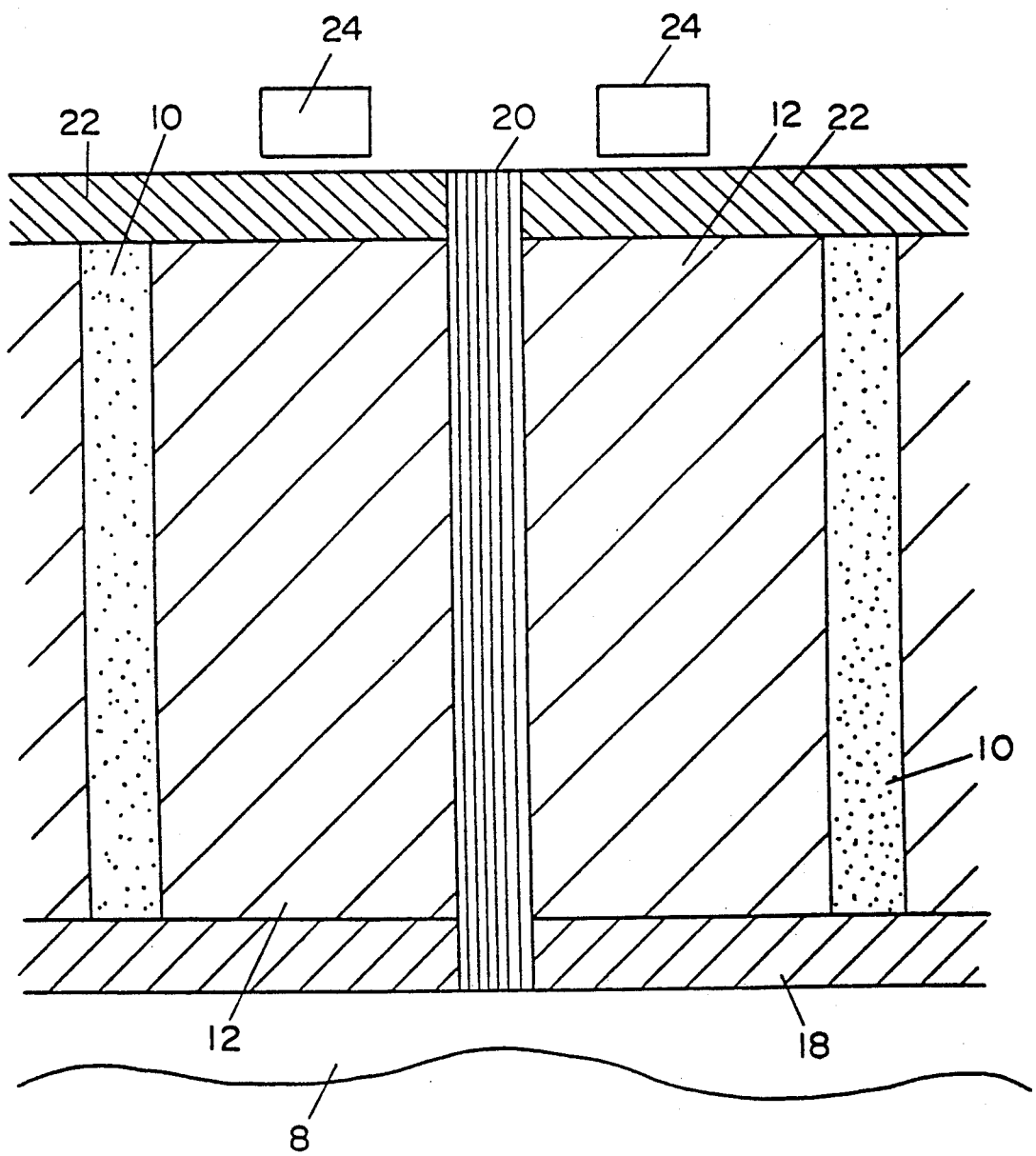
Figure 4:
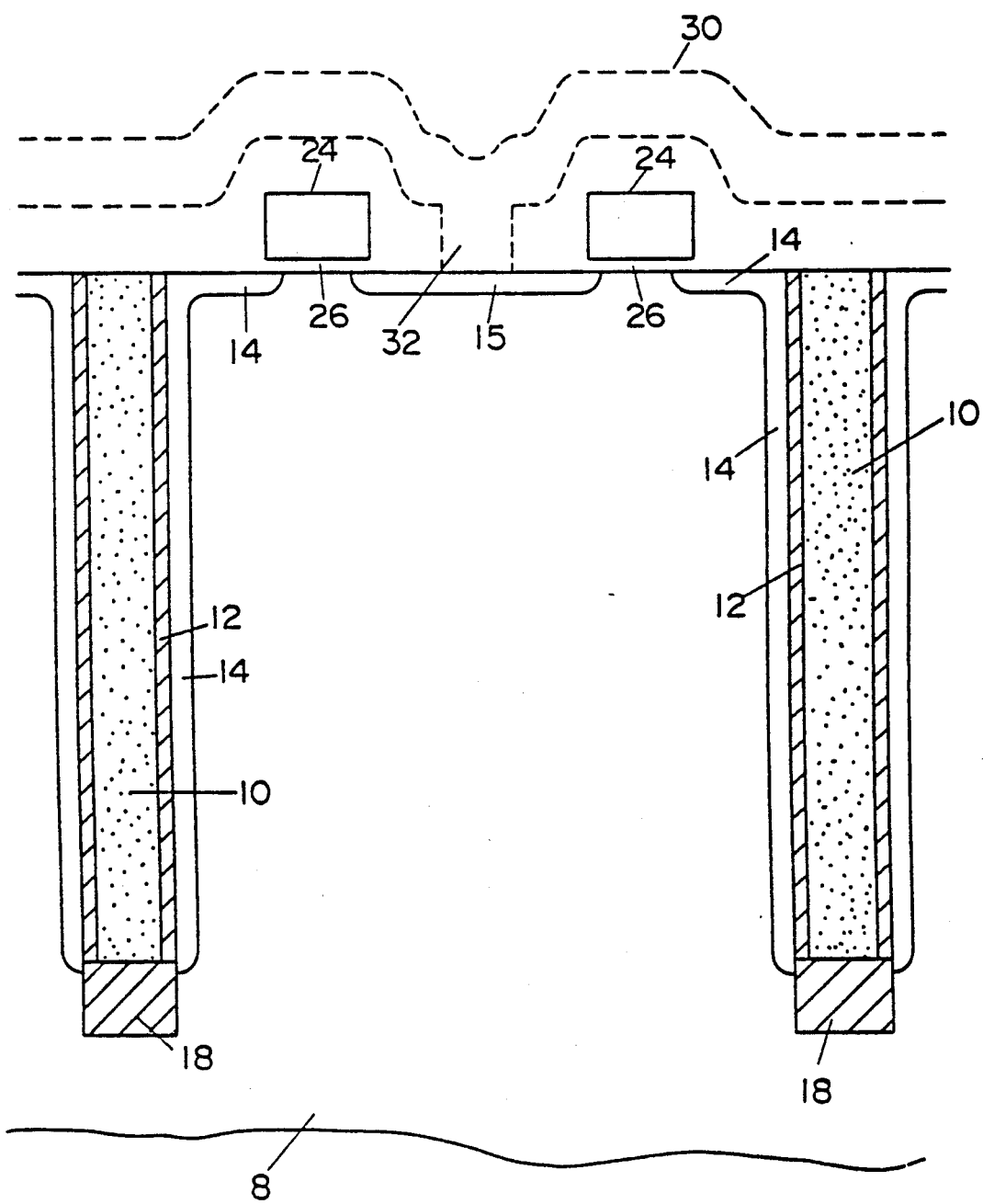

FIG. 1 to FIG. 4 show a DRAM according to a first embodiment of this invention. FIG. 1 (B) is a partially cut-away sectional view of one of its cells, and FIG. 1 (A) is its equivalent circuit diagram. FIG. 2 is a perspective view of its capacitor portion. FIG. 3 is a plan view of the same DRAM, in which one island region is insulated and isolated in the middle to be divided into two parts, and a cell transistor and a cell capacitor are incorporated into each part. FIGS. 4 (A) to (I), respectively, show sectional views taken along lines a—a' to i—i' of FIG. 3. FIG. 1 corresponds to region 100 in FIG. 3. In FIG. 1, incidentally, a metal wiring layer 30 corresponding to bit line and the contact part 32 between the metal wiring layer 30 and diffusion layer 15 in FIG. 3 are not shown.

Referring to these drawings, the structure and operation of the first embodiment will be described. As is clear from FIG. 3, one island region in which two memory cells are incorporated is surrounded by a fixed electrode 10 of a cylindrical storage cell capacitor, and between this fixed electrode 10 and cylindrical diffusion layer 14 is positioned a cylindrical dielectric layer 12 which serves as the dielectric of the storage capacitor. In the bottom 18 of the fixed electrode 10 of the storage capacitor comprised of a conductive polycrystal silicon membrane or the like, a channel stopper selectively forming a substrate of relatively high concentration and similar conductive impurities or an oxide having a relatively thick membrane is buried in order to electrically isolate the adjacent storage capacitors in the memory cell. Numeral 8 denotes a silicon substrate. One cell transistor comprises diffusion layers 14, 15 which serve as source, drain, and also gate electrode 24 and gate oxide membrane 26. Immediately beneath the gate electrode 24 is a shallow insulated isolation region 22 forming a storage capacitor. As shown in FIG. 1, the shallow insulated isolation region 22 functions to electrically isolate the sidewall diffusion layer 142 in the diffusion layer 14A, serving as the capacitor electrode for storing signal electric charge, from the upper diffusion layer 144 (14) formed integrally with this diffusion layer 14A and MOS transistor channel portion. The accumulated signal electric charge in the diffusion layer 14 flows, as indicated by arrow in FIG. 1, from the sidewall diffusion layer 142, side wall diffusion layer 146 to upper diffusion layer 144, and is read out into bit line 30 by way of diffusion layer 15 and contact portion 32 through transistor. The deep isolation region 20 is for electrically isolating two memory cells sharing the same contact portion, out of the memory cells adjacent in the direction of bit line 30, and is formed by selectively burying an insulation membrane such as a $SiO_2$ film. Or, a channel stopper may be selectively formed on the surface of silicon substrate on the sidewall of a groove.

Thus, the semiconductor memory device of the first embodiment is intended to electrically isolate two memory cells, by forming cylindrical cell capacitors around an island region in which two memory cells are incorporated, and separating this island region by an insulation layer 20. According to this constitution, a cell capacitor can be formed also in the cell transistor which makes up a memory cell, especially beneath its gate electrode, so that the capacity of the cell capacitor may be increased.

Figure 5:
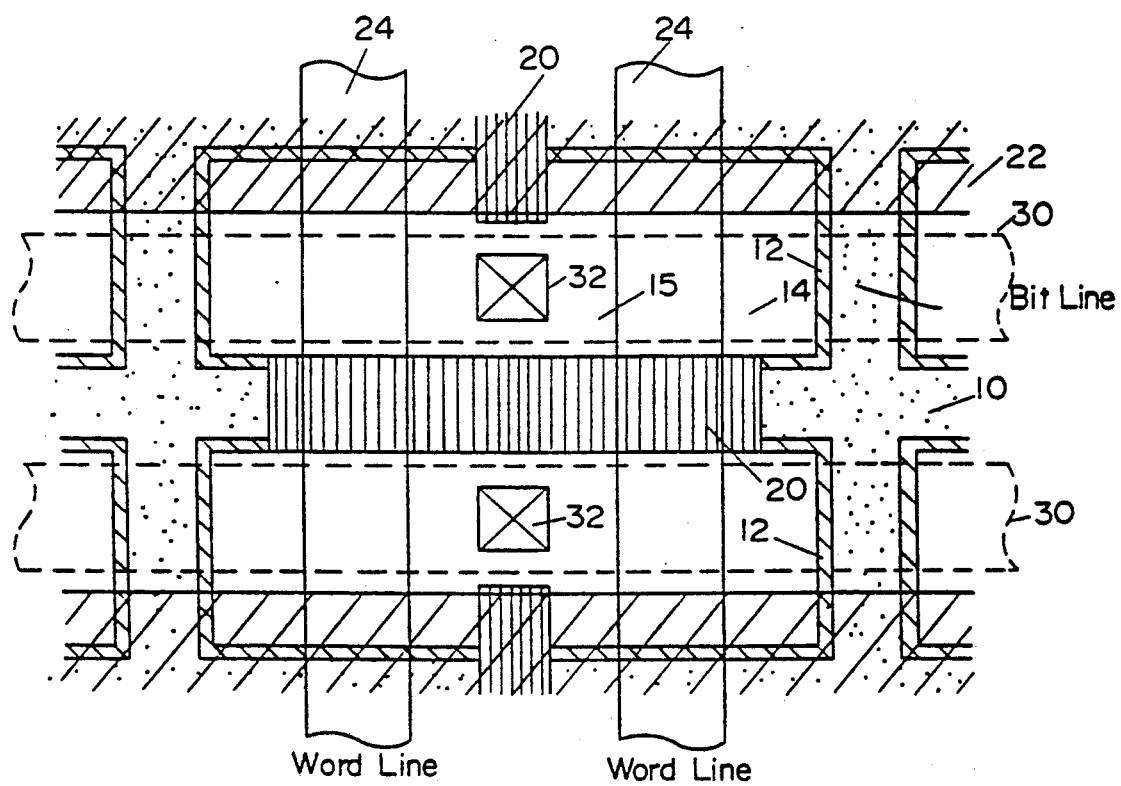
FIG. 5 is a plan view of a semiconductor memory device according to a second embodiment of this invention.

A plan view of a second embodiment of this invention is shown in FIG. 5. What is different from the first embodiment is that the cell capacitor formed immediately beneath the gate electrode 24 is disposed at only one side. That is, in the first embodiment, insulated isolation regions are formed at both sides of the end plane of cylindrical capacitor, while in the second embodiment, it is formed only at one side. Thus, since the cell capacitor is formed only at one side, only one shallow insulated isolation layer 22 is needed to form a cell transistor, which means that the area of the memory cell is smaller than that in the first embodiment.

Figure 6:
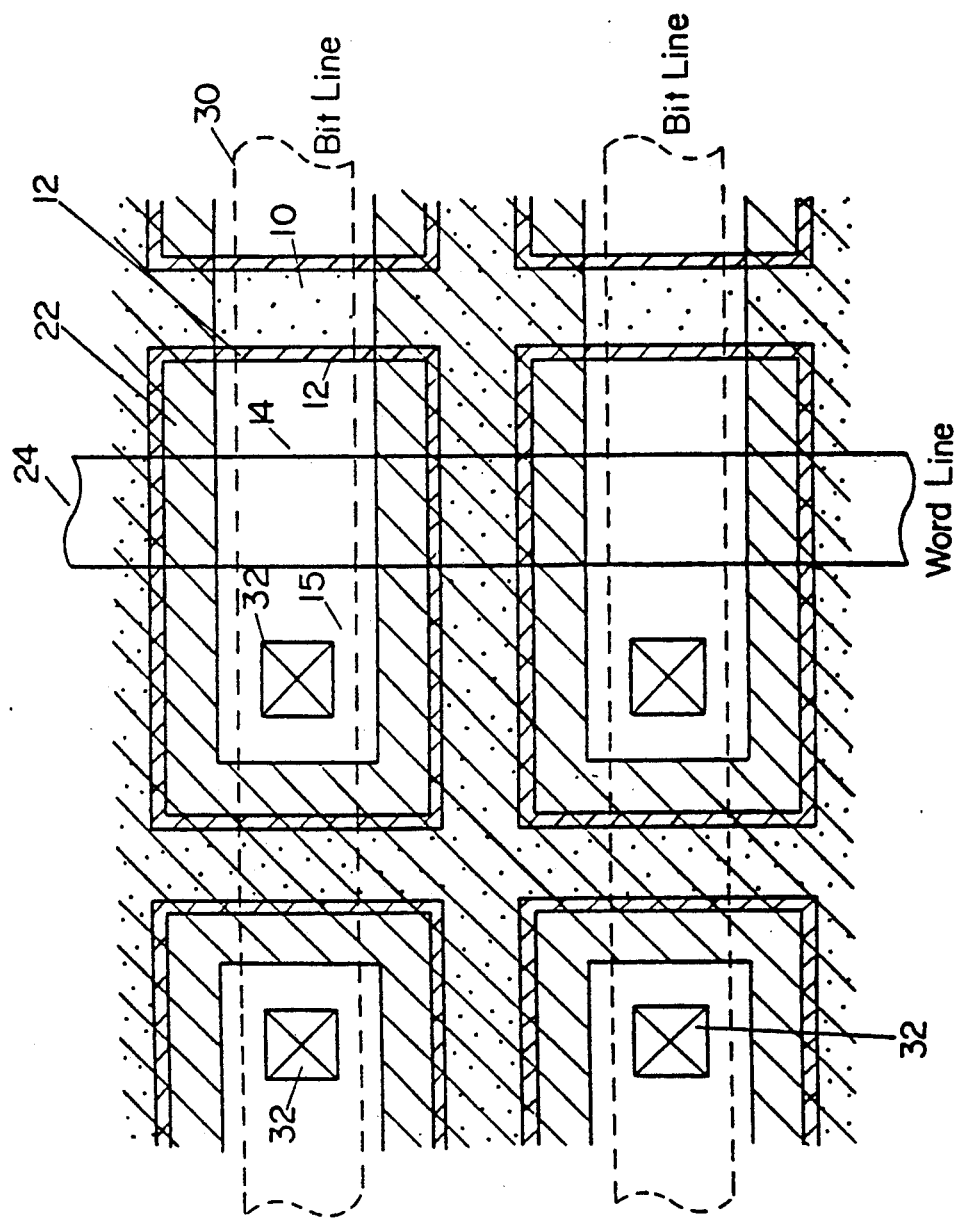
FIG. 6 is a plan view of a semiconductor memory device according to a third embodiment of this invention.

A plan view of a third embodiment of this invention is shown in FIG. 6. What is different from the first embodiment is that the entire circumference of one memory cell is used as the storage cell capacitor by disposing one contact portion 32 in each memory cell. As a result, the area of the storage cell capacitor per memory cell can be increased as compared with the first embodiment. Furthermore, as compared with the first embodiment, since the deep insulated isolation layer 20 for isolating the cells is not needed, the manufacturing process may be simplified.

Figure 7:
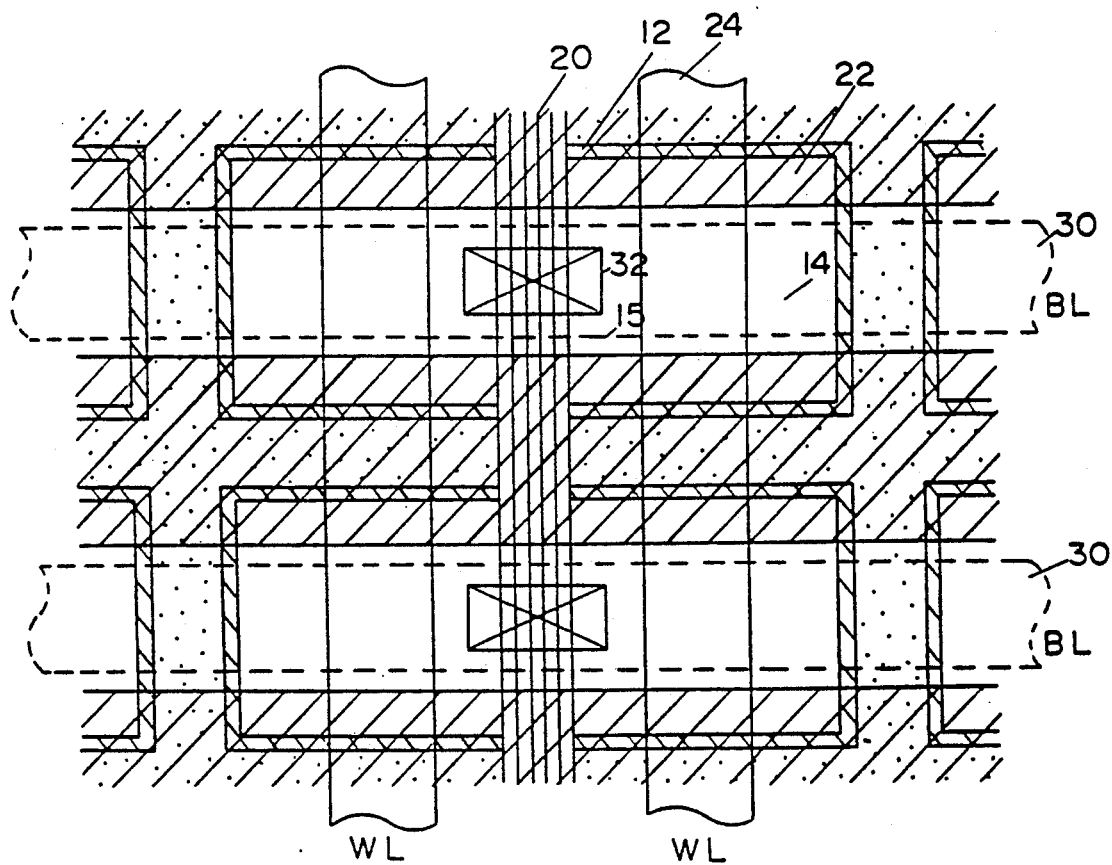
FIG. 7, FIG. 8 are plan views of semiconductor memory device according to fourth and fifth embodiments of this invention.

A plan view of a fourth embodiment of this invention is shown in FIG. 7. What is different from the first embodiment is that the diffusion capacity of the contact portion can be reduced by forming a deep isolation groove 20 filled with $SiO_2$ film or the like immediately beneath the contact portion 32. As a result, a greater read-out voltage is realized.

Figure 8:
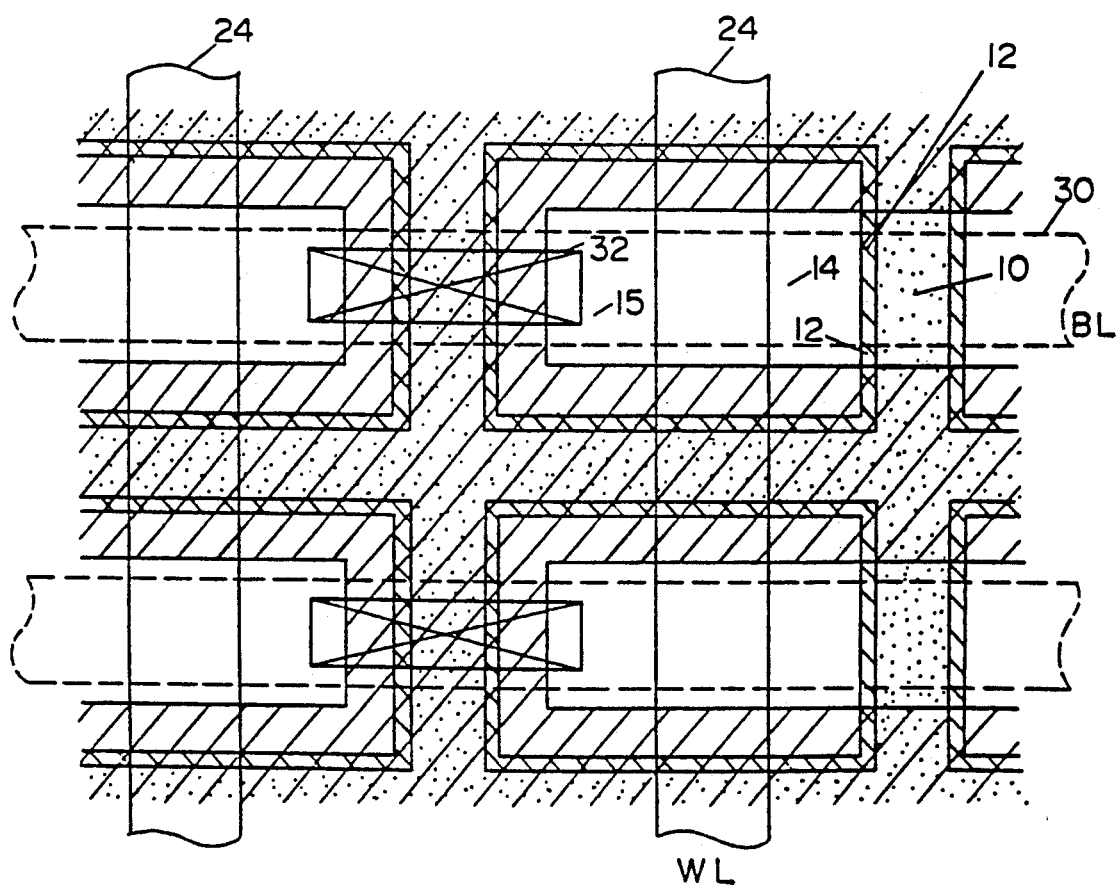

A plan view of a fifth embodiment of this invention is shown in FIG. 8. This is to reduce the area using the contact hole 32 commonly shared by adjacent cell transistors in the third embodiment.

Thus, by these embodiments, the area of the storage capacitor relative to the memory cell area can be significantly increased as compared with the prior art.

The fabricating method of this invention is described below while referring to a practical embodiment.

Figure 9D:
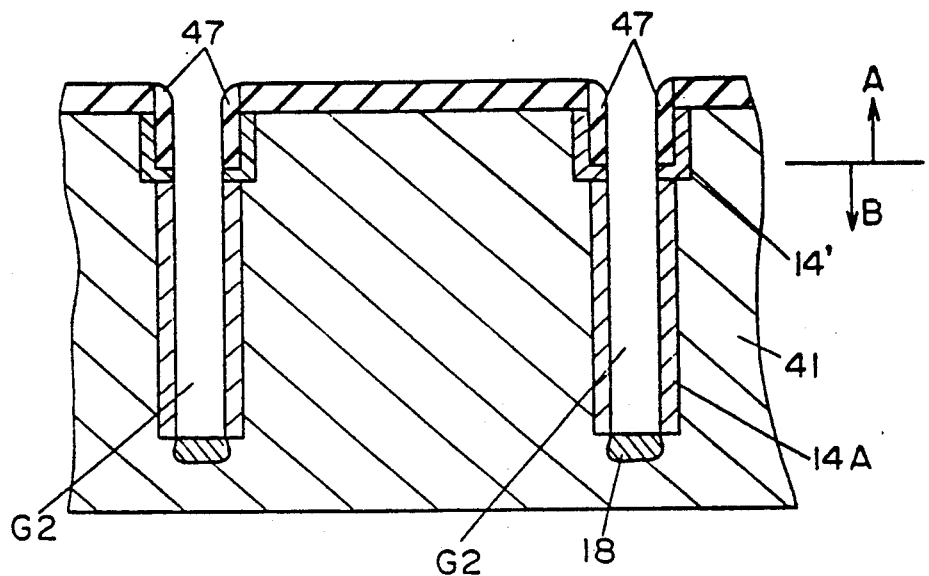
FIG. 9 is a sectional view showing the manufacturing process in a practical embodiment of this invention.
Figure 9E:
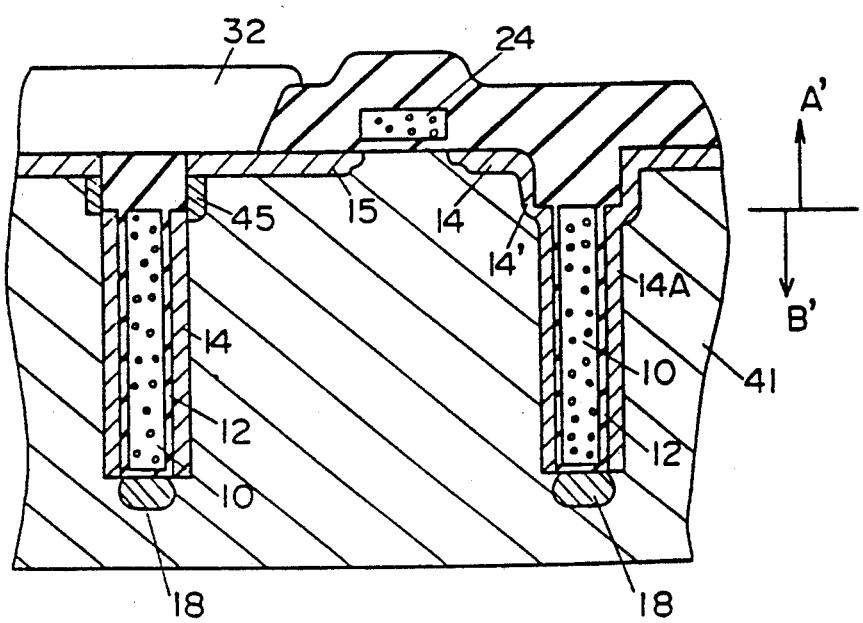

FIGS. 9 (a) to (e) illustrate the steps of this fabricating method. At step (a), an $SiO_2$ film 42 used as an oxide film for resist masking was formed on a P-type Si substrate 41 (corresponding to numeral 8 in FIG. 8), and a groove G about 0.5 μm deep was formed in the Si substrate 41 by etching. In this groove, by injecting n-type ions in some part and n-type ions in the other parts, including the wall of the groove, by ion beams 43, an n+ region 14' and a p+ region 45 were fabricated. In step (b), as an oxide film, an $SiO_2$ deposit film 46 having excellent covering characteristics was formed by using a reduced pressure CVD process. In step (c), by etching the surface by using a cathode coupling parallel plate type dry etching process (RIE process) using $C_3F_8$ gas, only the $SiO_2$ deposit film 46 was left on the sidewall of the groove. Numeral 47 denotes this remaining $SiO_2$ film. In step (d), the Si substrate 41 was etched again by using a RIE process to a depth of about 4 μm, thereby forming groove G2 after groove G. By introducing the impurities of n+, an n+ region 14 was formed, and a p+ region 18 was formed in the bottom of groove G2. Both the n+ region 14A and the p+ region 18 were formed by using an ion implantation process. Portion A shown at the right side of this process chart is covered with $SiO_2$ film 47 as a particular oxide film, so that it is completely free from effects when doping various impurities. The essential point of this invention is the $SiO_2$ film 47 left over on this vertical wall.

In the next step (e), the fabrication is nearly finished. Numeral 10 is polysilicon buried and formed in the groove. In portion A', gate electrode 24, n+ region source 14, and n+ region drain 15 are formed, and a MOS transistor having a wiring electrode 32 is shown, while portion B' refers to a cell capacitor having polysilicon 10 as a buried electrode, with a 10 nm thick thin oxide film 12 buried as a capacitor insulation film. Furthermore, in portion A', $SiO_2$ is buried to act as an insulation film.

The source electrode of this MOS transistor and cell capacitor portion are electrically connected with each other by means of the n+ region 14' formed in step (a), while the drain region 15 and the n+ region 14 as the other electrode portion of the capacitor are separated by p+ region formed in step (a).

Figure 10:
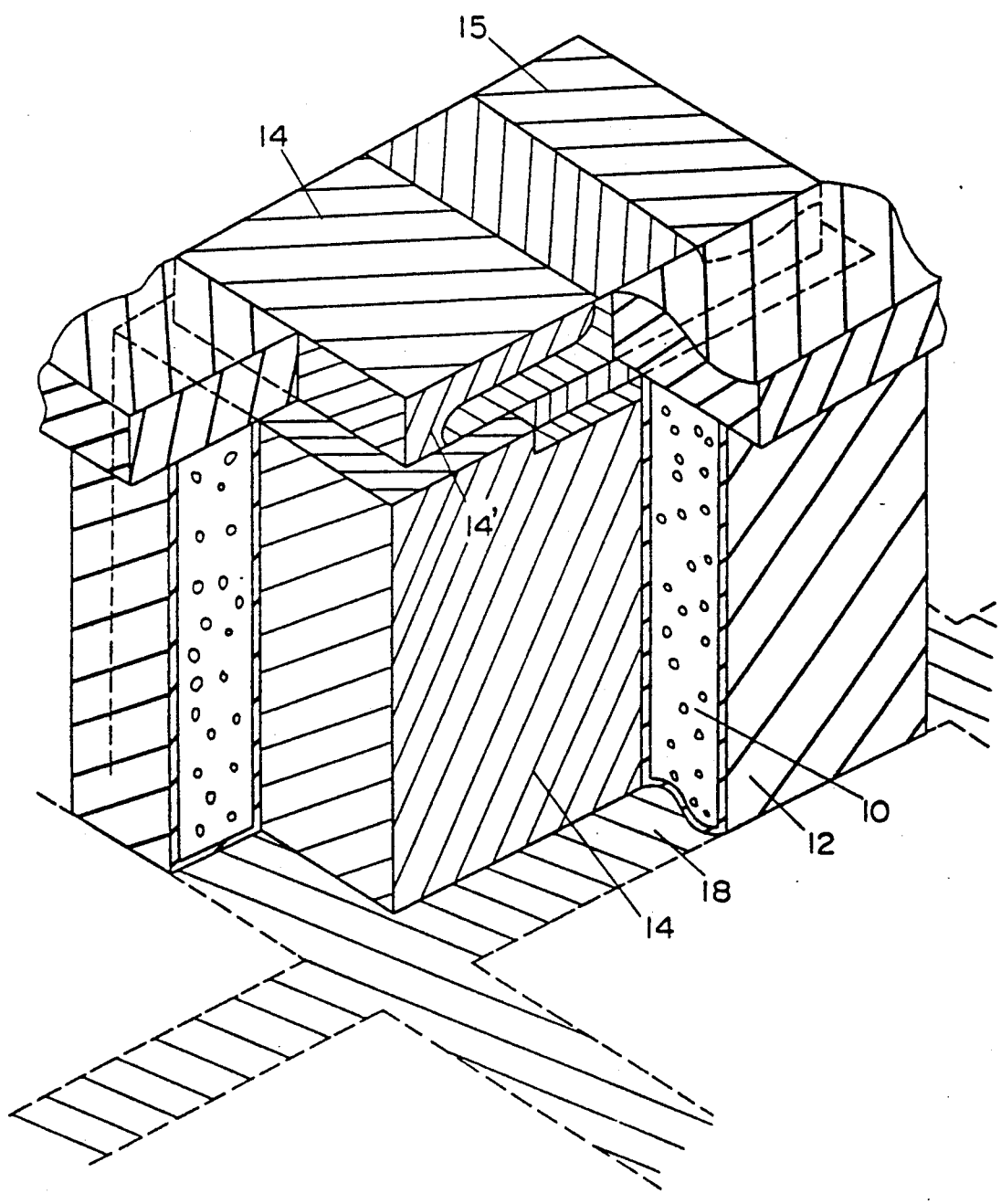
FIG. 10 is a perspective view showing, in a partial section, the structure of a dynamic cell fabricated by the method of this invention.

In FIG. 10, a solid view of the transistor portion of a dynamic memory cell fabricated by this process is shown corresponding to FIG. 9 (e). Meanwhile, the gate of MOS transistor and electrode, wiring and protective film on it are omitted in the drawings.

What we claim is:

1. A method of fabricating a semiconductor memory device comprising:

forming a first groove in a semiconductor substrate of a predetermined conductivity type, the side of the first groove defined by a sidewall of the substrate and the bottom of the first groove defined by a bottom wall of the substrate;

selectively forming, in the semiconductor substrate, a region of said predetermined conductivity type and a region of conductivity type opposite to said predetermined conductivity type by doping the sidewall defining said first groove with impurity using an ion-implantation technique;

depositing a film in said first groove;

etching the deposited film using an etching process having a strong anisotropy as measured in the vertical direction so as to expose said bottom wall of the substrate and leave the deposited film only on the sidewall of the substrate defining said first groove;

etching the semiconductor substrate at the exposed bottom wall thereof to form a second groove in the semiconductor substrate which extends from the bottom of said first groove to a location disposed within said substrate at which the bottom of said second groove is defined;

forming a capacitor of the memory device by forming a first electrode connected to said region of opposite conductivity type, a capacitor insulation layer, and a second electrode in said second groove;

burying an insulating layer for isolation in said first groove; and forming an MOS transistor having a source or drain region of another conductivity type defined in a portion of said semiconductor substrate.

2. The method of fabricating a semiconductor memory device as claimed in claim 1, wherein the depositing of the film comprises depositing an insulating film in said first groove using a reduced pressure CVD process.

3. The method of fabricating a semiconductor memory device as claimed of claim 1, wherein the forming of the first electrode of the capacitor comprises using an ion-implantation technique to form the first electrode on a sidewall of the substrate defining the side of said second groove.

4. The method of fabricating a semiconductor memory device as claimed of claim 1, and further comprising doping the semiconductor substrate at said location with an impurity of a conductivity type that is the same as that of the substrate to form an isolation region.

5. The method of fabricating a semiconductor memory device as claimed of claim 1, wherein the forming of the first groove comprises forming the first groove so as to surround a transistor region where said MOS transistor is formed, and the etching of the semiconductor substrate forms said second groove around a lower portion of said transistor region.

6. The method of fabricating a semiconductor memory device as claimed of claim 1, wherein the forming of the second electrode of said capacitor comprises forming a second electrode polysilicon in said second groove.

* * * * *

UNITED STATES PATENT AND TRADEMARK OFFICE
CERTIFICATE OF CORRECTION

PATENT NO. : 5,026,658

DATED : June 25, 1991

INVENTOR(S) : Genshu FUSE et al.

It is certified that error appears in the above-identified patent and that said Letters Patent is hereby corrected as shown below:

On the Title page, item [21], the Appln. No. has been corrected from "404,470" to --404,447--.

Signed and Sealed this

Twenty-ninth Day of December, 1992

Attest:

DOUGLAS B. COMER

Attesting Officer

Acting Commissioner of Patents and Trademarks